(12) United States Patent
Mashiko et al.

(10) Patent No.: US 7,166,024 B2
(45) Date of Patent: Jan. 23, 2007

(54) VENTILATION MEMBER AND VENTED HOUSING USING THE SAME

(75) Inventors: Hiroaki Mashiko, Ibaraki (JP); Toshiki Yanagi, Ibaraki (JP); Hiroyuki Nishii, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 10/438,066

(22) Filed: May 15, 2003

(65) Prior Publication Data

US 2003/0216119 A1    Nov. 20, 2003

(30) Foreign Application Priority Data

May 15, 2002    (JP)    ............... P2002-140629

(51) Int. Cl.
*F24F 3/16*    (2006.01)
(52) U.S. Cl. .................. 454/370; 55/385.4; 96/6; 454/270; 454/274
(58) Field of Classification Search ................ 454/370, 454/270, 271, 274, 275, 276; 210/321.6; 55/385.4; 95/46; 96/6
See application file for complete search history.

(56) References Cited

U.S. PATENT DOCUMENTS

| | | | | |
|---|---|---|---|---|
| 3,729,045 A | * | 4/1973 | MacDonald | ............... 160/371 |
| 4,401,093 A | * | 8/1983 | Gates et al. | ............... 123/573 |
| 4,466,553 A | * | 8/1984 | Zenger | ............... 220/495.08 |
| 5,080,001 A | * | 1/1992 | Ishibashi et al. | ............ 454/370 |
| 5,522,155 A | * | 6/1996 | Jones | ............ 34/286 |
| 5,522,769 A | | 6/1996 | DeGuiseppi | |
| 5,914,415 A | | 6/1999 | Tago | |
| 6,364,924 B1 | | 4/2002 | Mashiko et al. | |
| 2002/0090506 A1 | * | 7/2002 | Protzner et al. | ............ 428/334 |

FOREIGN PATENT DOCUMENTS

| | | |
|---|---|---|
| EP | 1 202 616 A1 | 5/2002 |
| JP | 05159765 A * | 6/1993 |
| JP | 10-85536 A | 4/1998 |
| JP | 2001-115502 * | 11/2000 |
| JP | 2001-143524 A | 5/2001 |
| WO | WO 92/09353 A1 | 6/1992 |

* cited by examiner

*Primary Examiner*—Gregory Wilson
(74) *Attorney, Agent, or Firm*—Sughrue Mion, PLLC

(57) ABSTRACT

A ventilation member having: a breathable film transmitting gas passing through an opening portion of a housing in a state in which the breathable film is fixed to the opening portion; and a support including a supporting portion for supporting the breathable film and an insertion portion to be inserted into the opening portion of the housing; wherein a lock structure for locking the support in the housing by rotating the support around a central axis of the support is formed in the insertion portion.

14 Claims, 14 Drawing Sheets

ND VENTED
HOUSING USING THE SAME

The present application is based on Japanese Patent Application No. 2002-140629, the entire contents of which are incorporated by reference.

BACKGROUND OF THE INVENTION

1. Field of the Invention

The present invention relates to a ventilation member fixed to a housing for automobile electrical components or the like, and the housing to which the ventilation member is fixed.

2. Related Art

Ventilation members are attached to various housings of automobile electrical components such as ECUs (Electronic Control Units), lamps, motors, various sensors, pressure switches and actuators; cellular phones; cameras; electric shavers; electric toothbrushes; and lamps for outdoor use.

Each of the ventilation members prevents water or dust from invading the inside of a housing while playing various roles in accordance with the kind of housing to which the ventilation member is attached. The roles include propagation of voice, discharge of gas generated inside the housing, and relaxation of a change of pressure inside the housing caused by a change of temperature.

FIGS. 13A and 13B show an example of a related-art ventilation member. A ventilation member 51 shown in each of FIGS. 13A and 13B is used for an equipment housing to be exposed to contaminants such as rain, muddy water or oils, for example, for automobile electric components. The ventilation member 51 has an L-shaped or U-shaped (not shown) tubular body. The ventilation member 51 may have a structure having a maze 52 internally. One end of the ventilation member 51 is outer-fitted to a neck portion 50a provided in a housing 50 so that the ventilation member 51 is fixed to the housing.

FIGS. 14A and 14B show another example of a related-art ventilation member. In a ventilation member 60 shown in FIGS. 14A and 14B, a substantially cylindrical body 62 is fitted to the inside of a cover part 61 so as to form a ventilation path between the inner circumference of the cover part 61 and the outer circumference of the substantially cylindrical body 62 and between the bottom surface of the cover part 61 and the bottom portion of the substantially cylindrical body 62. When an opening in the bottom portion of the substantially cylindrical body 62 is covered with a filter 63, the ventilation member 60 can also exert a higher water-proofing property and a higher dust-proofing property (disclosed in Japanese Patent Laid-Open No. 2001-143524). An opening 62a in the top portion of the substantially cylindrical body 62 is outer-fitted to the neck portion 50a of the housing 50 so that the ventilation member 60 is fixed to the housing.

FIG. 15 shows another example of a related-art ventilation member. In a ventilation member 70 shown in FIG. 15, a tapered insertion portion 71a is formed in one end portion of a disc-like elastomer member 71, while a splash guard cover 71b is formed on the other end portion of the disc-like elastomer member 71, and a breathable film 72 is fixedly deposited on the way of a ventilation flow path penetrating between the one end portion and the outer circumference of the other end portion. A sealing/fixing portion 71c for fixedly retaining a housing 7 in cooperation with the insertion portion 71a is formed in the outer circumference of the elastomer member 71 (disclosed in Japanese Patent Laid-Open No. 85536/1998). The insertion portion 71a is pressed into the opening portion of the housing so that the ventilation member 70 is fixed to the housing.

However, the ventilation members have the following problems.

Each of the ventilation members 51 and 60 shown in FIGS. 13A and 13B and FIGS. 14A and 14B is fixed to the housing 50 only by outer fitting to the neck portion 50a of the housing 50. Therefore, there is a possibility that the ventilation member may be pulled out of the housing.

On the other hand, in the ventilation member 70 shown in FIG. 15, the surface abutting against the housing 7 is made of elastomer. Therefore, when oil invades a part of the surface of the ventilation member 70 abutting against the housing 7, it becomes easy to detach the ventilation member 70 from the housing. It cannot be therefore said that the ventilation member 70 is suitable as a ventilation member for a housing used in an environment easy for oil to adhere to the ventilation member.

SUMMARY OF THE INVENTION

According to the invention, there is provided a ventilation member having: a breathable film transmitting gas passing through an opening portion of a housing in a state in which the breathable film is fixed to the opening portion; and a support including a supporting portion for supporting the breathable film and an insertion portion to be inserted into the opening portion of the housing; wherein a lock structure for locking the support in the housing by rotating the support around a central axis of the support is formed in the insertion portion.

According to the ventilation member of the invention, the possibility that the ventilation member is pulled out of the housing can be reduced.

DETAILED DESCRIPTION OF THE PREFERRED EMBODIMENTS

Preferred embodiments of the invention will be described with reference to the drawings.

Embodiment 1

Description will be made about an embodiment of a ventilation member according to the invention with reference to FIGS. 1, 2A, 2B, 3, 4A, 4B, 5A to 5G, 6A to 6F, 7A, and 7B.

Figure 1:
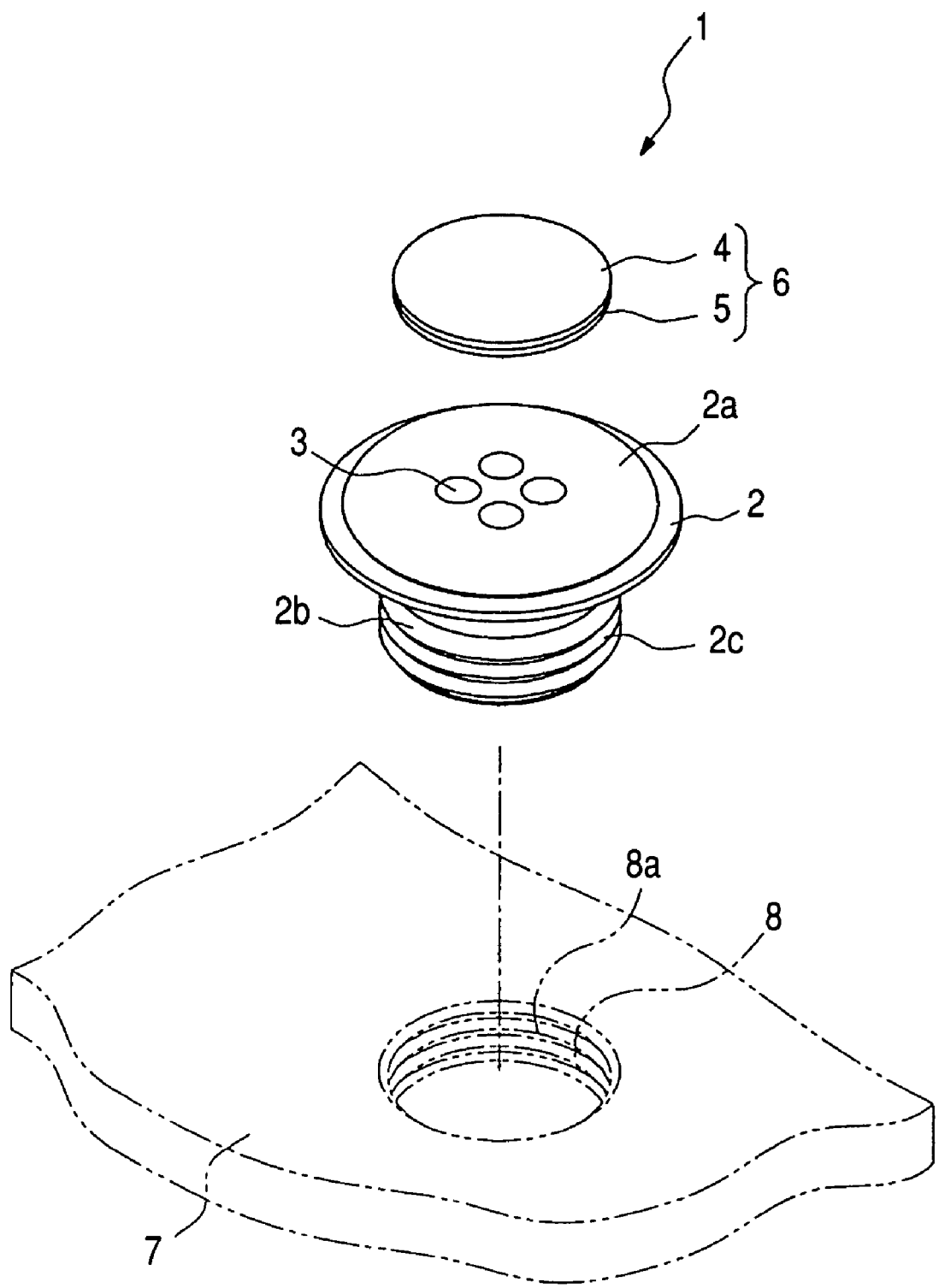
FIG. 1 is an exploded view showing an example of a ventilation member according to the invention.
Figure 2A:
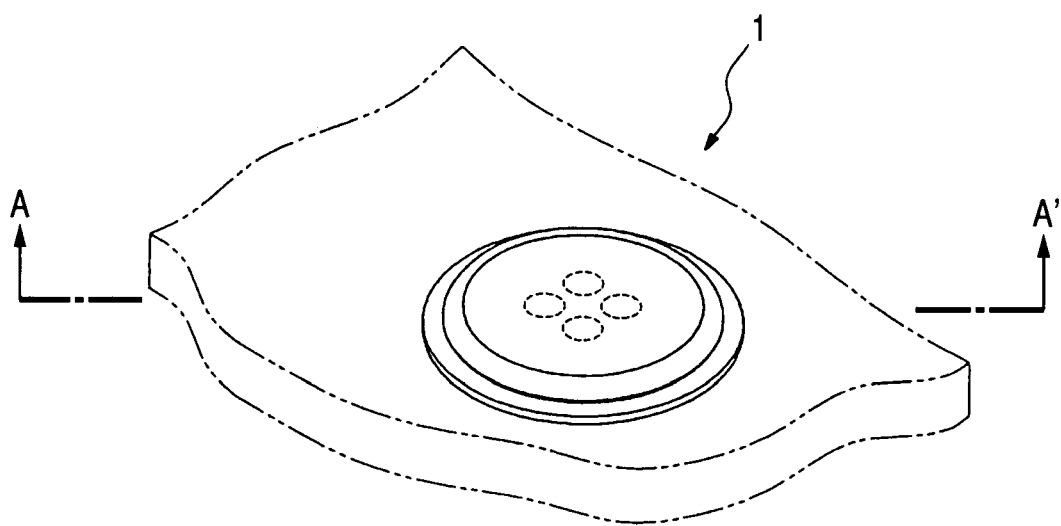
FIG. 2A is a view for explaining the state where the ventilation member shown in FIG. 1 has been fixed to a housing.
Figure 2B:
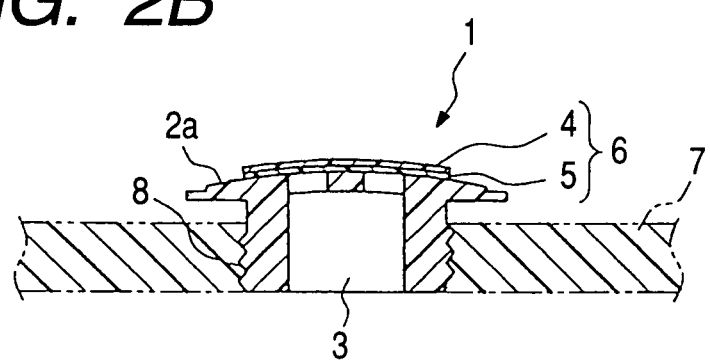
FIG. 2B is a sectional view taken on line A–A' in FIG. 2A.

A ventilation member 1 shown in FIGS. 1, 2A and 2B is a ventilation member including a breathable film 4. The breathable film 4 transmits gas passing through an opening portion 8 of a housing 7 when the breathable film 4 is fixed to the opening portion 8. The ventilation member 1 further includes a support 2. The support 2 includes a supporting portion 2a for supporting the breathable film 4, and an insertion portion 2b to be inserted into the opening portion 8 of the housing 7. A spiral groove 2c is formed in the outer circumference of the insertion portion 2b. By screwing the insertion portion 2b down to a female screw 8a formed in the opening portion 8 of the housing 7, the ventilation member 1 can be fixed to the opening portion 8 of the housing 7. Thus, the possibility that the ventilation member 1 is pulled out of the housing 7 can be reduced. In addition, the ventilation member 1 can be removed from the housing 7 in accordance with necessity.

Through holes 3 penetrating the supporting portion 2a and the insertion portion 2b are formed in a central portion of the support 2. The breathable film 4 is fixedly attached to the supporting portion 2a so as to cover the through holes 3. The size of the through holes 3 may be determined appropriately in consideration of the kind of housing to which the ventilation member 1 is fixed and the permeability of the breathable film 4. The area of the through holes 3 (area on a plane perpendicular to the gas permeable direction) may be set to be 0.001–100 cm$^2$.

In addition, a plurality of through holes 3 are provided in the surface abutting against the breathable film 4 as shown in FIG. 2B. When a plurality of through holes 3 are formed in the surface covered with the breathable film 4 in such a manner, the center of the breathable film 4 is also supported by the supporting portion 2a. It is therefore possible to suppress the damage of the breathable film 4 from external force.

The shape of the supporting portion 2a is not limited particularly, but may be like a disc having a larger diameter than that of the insertion portion 2b, as shown in FIGS. 1, 2A and 2B. The supporting portion 2a may have a larger diameter than that of the opening portion 8 formed in the housing 7 so as to be disposed to cover the opening portion 8.

In addition, the surface of the supporting portion 2a abutting against the breathable film 4 is formed into a curved surface as shown in FIG. 2B. In such a manner, when the curved surface having a circumferential edge portion lower in height than a central portion is used as the supporting surface, the property of water drainage is improved suitably as a property of a ventilation member for a housing for use in an environment easy to be affected by water. Incidentally, in place of the curved surface of the supporting portion 2a abutting against the breathable film 4 as described above, for example, the shape of the supporting portion 2a may be formed into a conical shape. In this case, the breathable film 4 is fixedly attached to the slope of the conical shape so that the property of water drainage can be improved.

Thermoplastic resin easy to mold is preferably used as the material of the support 2 without any particular limitation. Examples of such thermoplastic resin to be used include polybutyleneterephthalate (PBT), polyphenylene sulfide (PPS), polysulfone (PS), polypropylene (PP), polyethylene (PE), ABS resin, thermoplastic elastomer, or composite materials of these thermoplastic resins. Other than the thermoplastic resins, composite materials in which reinforcement materials such as glass fibers or carbon fibers, or metal is compounded with thermoplastic resin so as to improve the heat resistance, the dimensional stability and the rigidity may be used.

When the housing to which the ventilation member is fixed is used in an environment having a large change in temperature, it is preferable that materials low in deterioration caused by heat, for example, the thermoplastic resins other than thermoplastic elastomer are used as the material of the support. Particularly, PBT, PPS or PS is preferred.

The method for forming the support 2 is not limited particularly. For example, the support 2 may be formed by injection molding or cutting.

The material, structure and form of the breathable film 4 are not limited particularly if sufficient permeability can be secured. It is, however, preferable to select at least one kind from fluororesin porous materials and polyolefin porous materials. Examples of fluororesins include polytetrafluoroethylene (PTFE), polychlorotrifluoroethylene, tetrafluoroethylene-hexafluoropropylene copolymer, tetrafluoroethylene-perfluoro alkyl vinyl ether copolymer, and tetrafluoroethylene-ethylene copolymer. Examples of polyolefin monomers include ethylene, propylene, 4-methylpentene-1, and 1-butene. Polyolefins obtained by simply polymerizing or copolymerizing these monomers may be used. In addition, two or more kinds of such polyolefins may be blended, or laminated in layers. Of these, PTFE porous material is particularly preferred because it can keep permeability even in a small area and has a high function of preventing water or dust from invading the inside of the housing.

As shown in FIG. 1 and FIG. 2B, a reinforcement material 5 may be laminated to the breathable film 4. When the reinforcement material 5 is laminated to one side of the breathable film 4 in such a manner, the reinforcement material 5 may be laminated to a surface opposite to the surface shown in FIGS. 1 and 2B. The material, structure and form of the reinforcement material 5 are not limited particularly. It is, however, preferable to use a material having a pore size larger than that of the breathable film 4 and superior in gas permeability, such as woven fabric, nonwoven fabric, mesh, net, sponge, foam, metal porous material, or metal mesh. When heat resistance is required, it is preferable to use a reinforcement material made of polyester, polyamide, aramid resin, polyimide, fluororesin, ultra high molecular weight polyethylene, or metal. Incidentally, although the reinforcement material 5 is laminated to one side of the breathable film 4 in the embodiment shown in FIGS. 1 and 2B, the reinforcement material 5 may be laminated to the both sides of the breathable film 4.

As for the method for laminating the reinforcement material 5 to the breathable film 4, they may be put on top of each other simply, or joined to each other. For example, the joining may be performed in a method of adhesive lamination, thermal lamination, heating deposition, ultrasonic deposition, or adhesion with an adhesive agent. For example, when the breathable film 4 and the reinforcement material 5 are laminated by thermal lamination, a part of the reinforcement material 5 may be heated and melted to be bonded to the breathable film 4. Alternatively, the breathable film 4 and the reinforcement material 5 may be bonded through a fusion bonding agent such as hot melt powder.

Liquid-repellent treatment such as water-repellent treatment or oil-repellent treatment may be given to the breathable film 4 in accordance with the application of the housing. The liquid-repellent treatment can be carried out by applying the breathable film 4 with a substance having a small surface tension, drying the substance and then curing the substance. The liquid-repellent agent is not limited particularly so long as a coat lower in surface tension than the breathable film can be formed as the liquid-repellent agent. It is, however, preferable to use polymer having a perfluoro alkyl group. Examples of such polymers for use include Fluorad (made by Sumitomo 3M Ltd.), Scotchguard (made by Sumitomo 3M Ltd.), Texguard (made by Daikin Industries, Ltd.), Unidyne (made by Daikin Industries, Ltd.), and Asahi Guard (made by Asahi Glass Co., Ltd.) (all under trade names). The liquid-repellent agent may be applied by impregnation or spraying.

As for the method for supporting the breathable film 4 on the supporting portion 2a, a method of heating deposition, ultrasonic deposition or adhesion using an adhesive agent is suitable because peeling or floating hardly occurs. From the point of view of handiness, heating deposition or ultrasonic deposition is preferred. When the reinforcement material 5 is laminated to the breathable film 4, any supporting method may be employed without particular limitation as long as the reinforcement material 5 can be fixedly attached to the support 2. Incidentally, when a high liquid-repellent property is required, preferably, the reinforcement material 5 is fixedly attached to the support 2 while the surface higher in liquid-repellent property faces the outside of the housing.

As another method for supporting the breathable film 4 on the supporting portion 2a, the breathable film 4 may be disposed in a mold for forming the support 2 when the support 2 is injection-molded. In this case, the breathable film 4 is integrated with the support 2.

Figure 3:
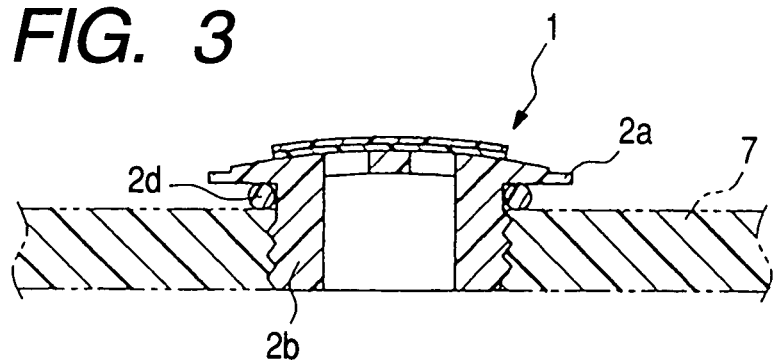
FIG. 3 is a sectional view showing another example of the ventilation member according to the invention.

In addition, when a seal portion 2d is provided on the surface of the supporting portion 2a facing the housing as shown in FIG. 3, the adhesion or air tightness between the housing 7 and the ventilation member 1 can be enhanced. Particularly, when thermoplastic resin other than elastomer is used for the supporting portion 2a, it is preferable to form the seal portion 2d so as to enhance the sealing performance.

Examples of preferred materials for the sealing portion 2d include elastomers or foams such as nitrile-butadiene rubber (NBR), ethylene-propylene rubber (EPM or EPDM) and silicone rubber.

For example, the seal portion 2d may be provided by outer fitting an O-ring of the above-mentioned material to the insertion portion 2b, or may be formed on one side of the supporting portion 2a by two-color molding.

Figure 4A:
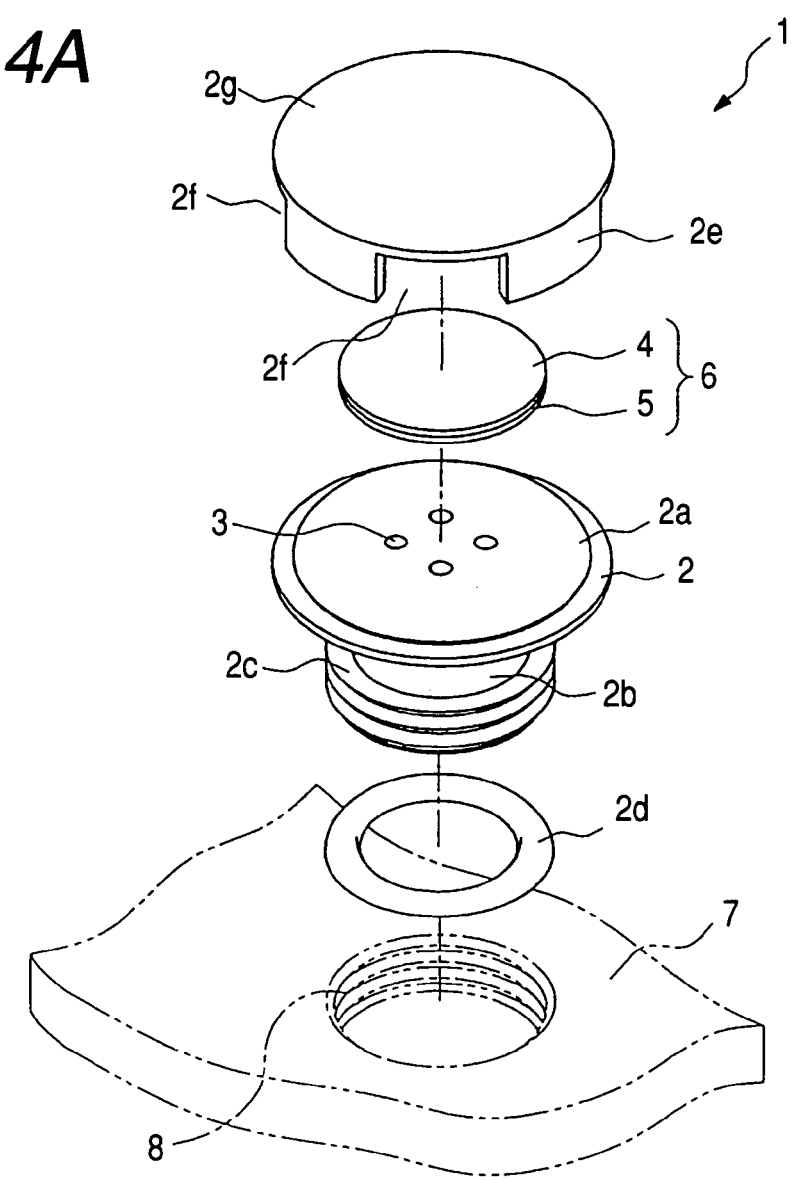
FIG. 4A is an exploded view showing another example of the ventilation member according to the invention.
Figure 4B:
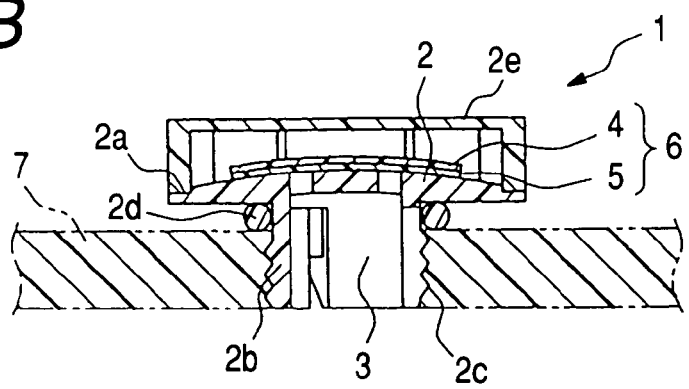
FIG. 4B is a sectional view of the ventilation member shown in FIG. 4A.
Figure 5A:
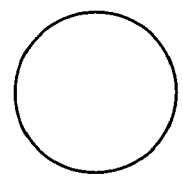
FIGS. 5A to 5G are views of supports of ventilation members according to the invention when observed in the gas permeable direction.
Figure 5B:
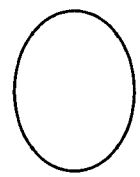
Figure 5C:
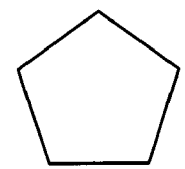
Figure 5D:
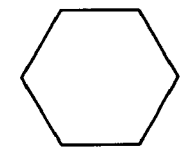
Figure 5E:
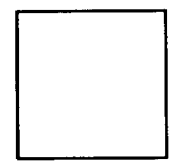
Figure 5F:
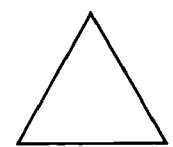
Figure 5G:
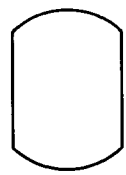

In addition, when the support 2 has a protective portion 2e covering at least a part of the breathable film 4 from above of the breathable film 4 as shown in FIGS. 4A and 4B, it is possible to reduce the possibility that the breathable film 4 is damaged by external force or the ventilation is blocked by sand or mud accumulated on the surface of the breathable film.

The shape of the protective portion 2e is not limited particularly as long as it is a shape not spoiling the permeability of the ventilation member 1. It is, however, preferable that a plurality of opening portions 2f are formed in positions where they cannot be viewed when observed in the gas permeable direction, for example, in the side surface of the protective portion 2e as in the embodiment shown in FIGS. 4A and 4B. Incidentally, opening portions 2f maybe also formed in an upper surface 2g of the protective portion 2e as long as the opening portions 2f do not spoil the effect of protecting the breathable film 4. In addition, it is preferable that the opening portions 2f are formed as divided small holes from the point of view of keeping the strength of the support 2 and effectively preventing invasion of matters.

As the material of the protective portion 2e, a material similar to that of the other portion of the support 2 may be used. The method for integrating the protective portion 2e with the other portion of the support 2 is not limited particularly. The integration may be attained in a method of heating deposition, ultrasonic deposition, vibration deposition, adhesion using an adhesive agent, fitting, or screwing. Particularly, heating deposition or ultrasonic deposition is preferred because of its low cost and easiness.

In addition, in order to make the ventilation member 1 easy to screw down with a tool or fingers, it is preferable that the outer shape of the support 2 is a shape selected from a circle and polygons when the support 2 is observed in the gas permeable direction. Examples of such a shape include a perfect circle, an ellipse, a hexagon, a pentagon, a quadrangle, and a triangle as shown in FIGS. 5A to 5F. In addition to the shapes described above, for example, as shown in FIG. 5G, the outer shape of the support 2 observed in the gas permeable direction may be a shape having a straight line portion in its outline, preferably a shape having a pair of straight line portions parallel with each other.

In addition, when an engagement structure with which a tool can be engaged is provided in the support 2, the ventilation member 1 can be fixed to the housing 7 efficiently. It is preferable that the engagement structure includes at least one kind selected from a convex portion and a concave portion. In addition, it is preferable that the engagement structure is formed in at least one surface selected from the surface of the support which can be viewed when the support is observed in the gas permeable direction from the outside of the housing, and the outer circumferential surface of the support.

Figure 6A:
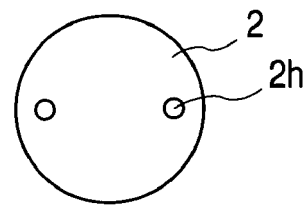
FIGS. 6A to 6F are views of supports of ventilation members according to the invention when observed in the gas permeable direction.
Figure 6B:
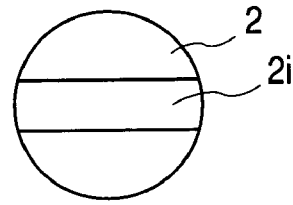
Figure 6C:
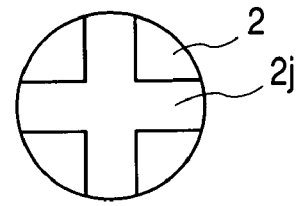
Figure 6D:
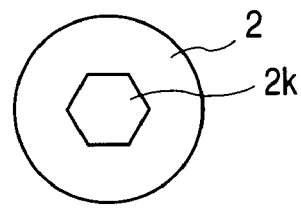
Figure 6E:
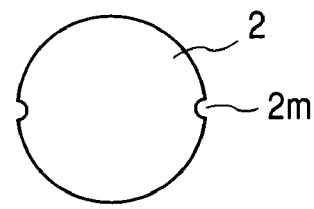
Figure 6F:
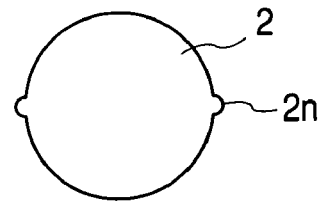

The engagement structure is, for example, of convex or concave portions 2h formed in the surface of the support which can be viewed when the support 2 is observed in the gas permeable direction from the outside of the housing, as shown in FIG. 6A. The convex or concave portions 2h are formed symmetrically with respect to the center of this surface. The outer shape of each of the convex or concave portions 2h is circular. Alternatively, as shown in FIGS. 6B to 6D, the engagement structure may be formed into a convex or concave portion 2i having a − (minus) shape as its outer shape formed in the surface of the support 2 which can be viewed when the support 2 is observed in the gas permeable direction from the outside of the housing, a convex or concave portion 2j having a + (plus) shape as its outer shape likewise, or a convex or concave portion 2k having a polygonal shape as its outer shape likewise. Alternatively, as shown in FIG. 6E or 6F, the engagement structure may be formed into concave portions 2m or convex portions 2n, which are formed in the outer circumferential surface of the support 2 and symmetrically with respect to the central axis of the support 2 and whose outer shape is semicircular when the support 2 is observed in the gas permeable direction.

In addition, if the convex portions 2h, 2i, 2j, 2k and 2n are designed to be broken when force not smaller than predetermined one is applied thereto, it becomes difficult to detach the ventilation member 1 from the housing 7 after the ventilation member 1 is fixed to the housing 7. Thus, it is possible to prevent the ventilation member 1 from being detached from the housing 7.

Embodiment 2

Another embodiment of a ventilation member according to the invention will be described with reference to FIGS. 7A and 7B and FIGS. 8A to 8C.

Figure 7A:
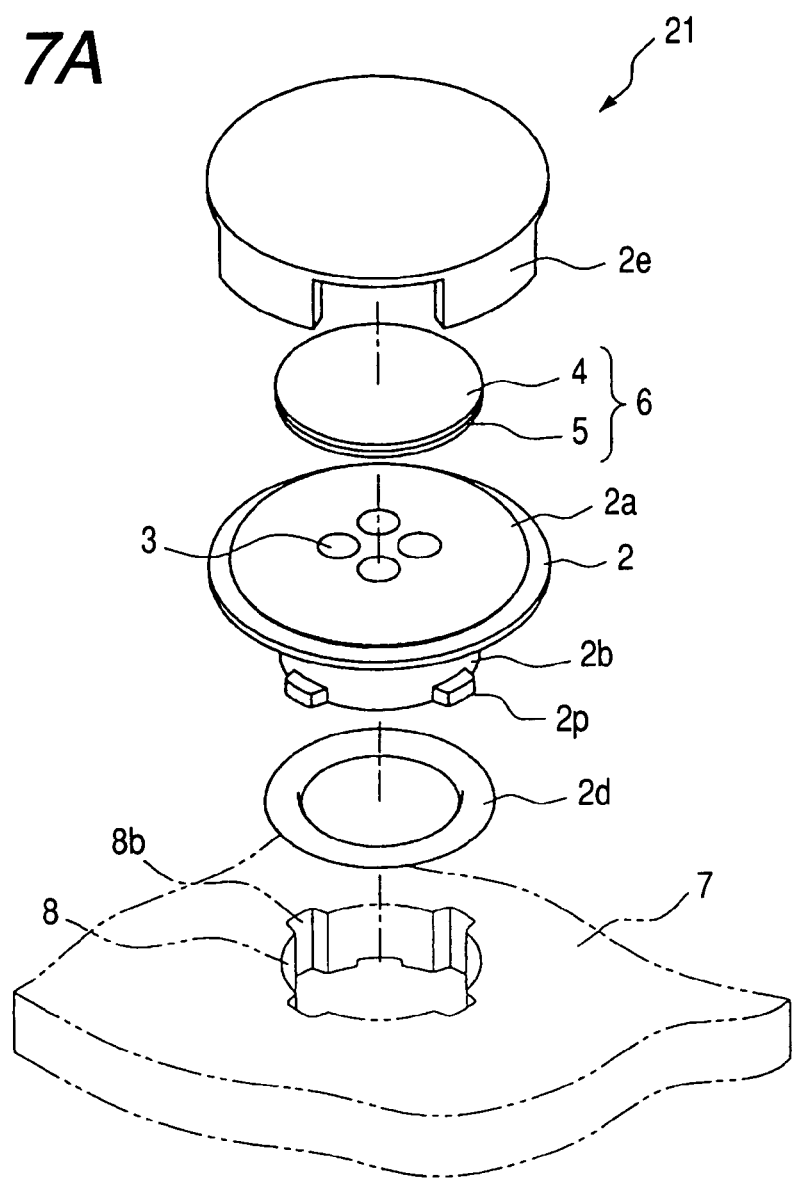
FIG. 7A is an exploded view showing an example of a ventilation member according to the invention.
Figure 7B:
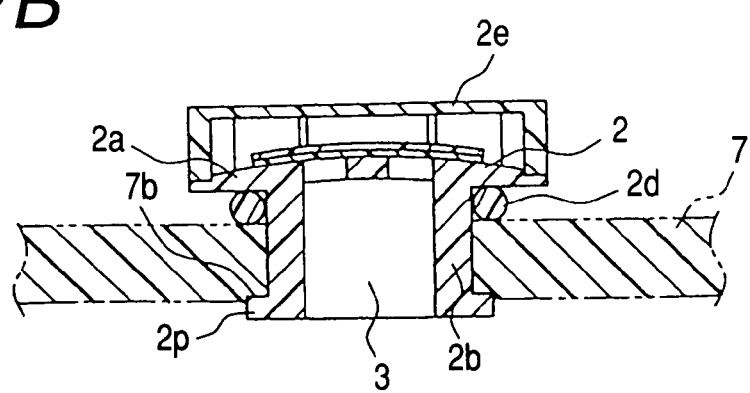
FIG. 7B is a sectional view of the ventilation member shown in FIG. 7A.

A ventilation member 21 shown in FIGS. 7A and 7B is a ventilation member including a breathable film 4. The breathable film 4 transmits gas passing through an opening portion 8 of a housing 7 when the breathable film 4 is fixed to the opening portion 8. The ventilation member 21 further includes a support 2. The support 2 includes a supporting portion 2a for supporting the breathable film 4, and an insertion portion 2b to be inserted into the opening portion 8 of the housing 7. At least one protrusion portion 2p is formed in the outer circumference of the insertion-start-side end portion of the insertion portion 2b.

The insertion portion 2b has a columnar shape whose diameter is substantially the same as that of the opening portion 8 of the housing 7 in the embodiment shown in FIGS. 7A and 7B. Four protrusion portions 2p are formed in the outer circumference of the insertion-start-side end portion of the insertion portion 2b. When the ventilation member 21 is fixed to the housing 7, first, the insertion portion 2b is inserted into the opening portion 8 of the housing 7 while fitting the protrusion portions. 2p into guide grooves 8b formed in the inner surface of the opening portion 8. Successively, when the support 2 is rotated in one direction around the central axis of the support 2, the protrusion portions 2p are fitted to fitting grooves 7b formed in the inner surface of the housing 7 so that the ventilation member 21 can be fixed to the opening portion 8 of the housing 7.

Figure 8A:
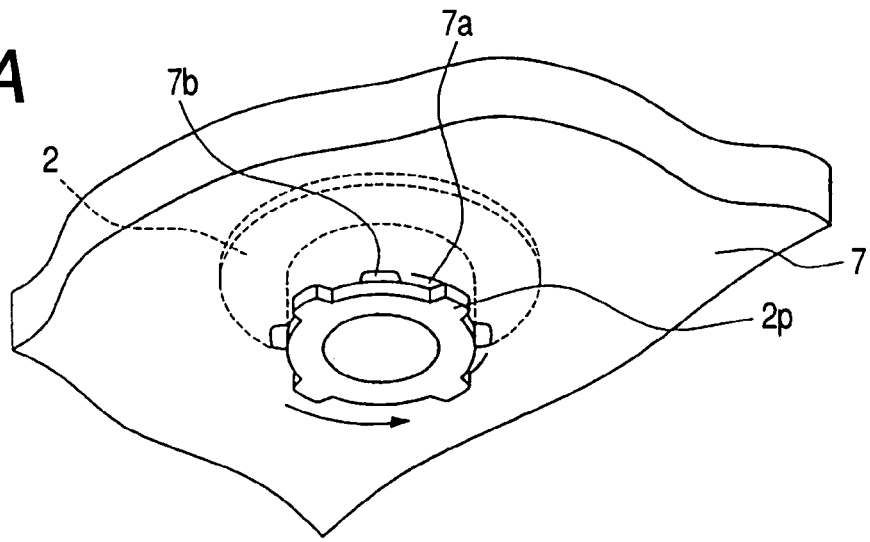
FIGS. 8A to 8C are views for explaining the operation of fixing the ventilation member shown in FIGS. 7A and 7B to a housing.
Figure 8B:
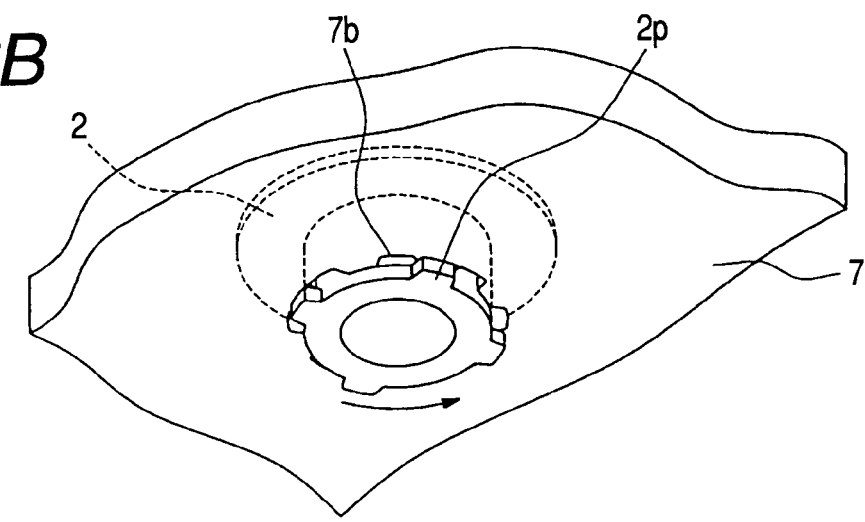
Figure 8C:
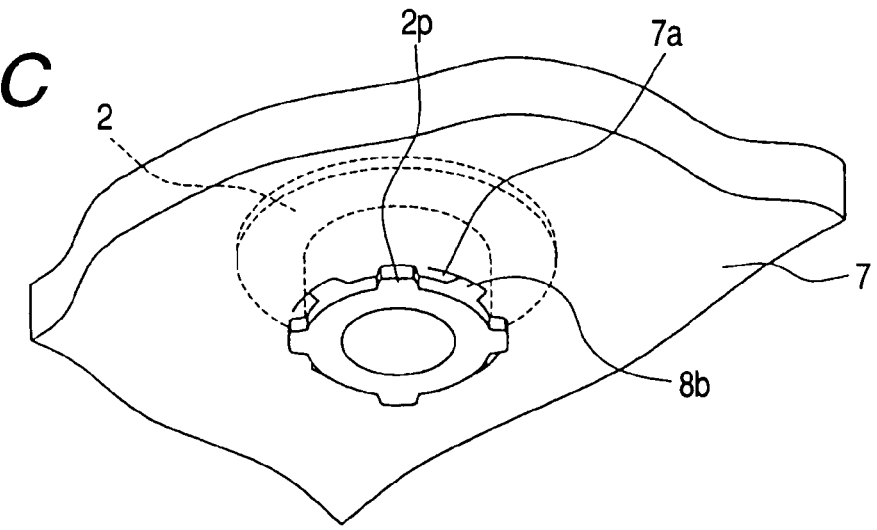
Figure 9A:
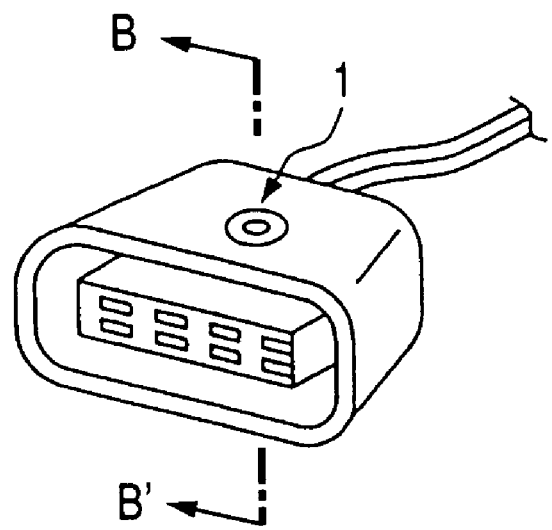
FIG. 9A is a perspective view of a connector to which a ventilation member according to the invention has been fixed.
Figure 9B:
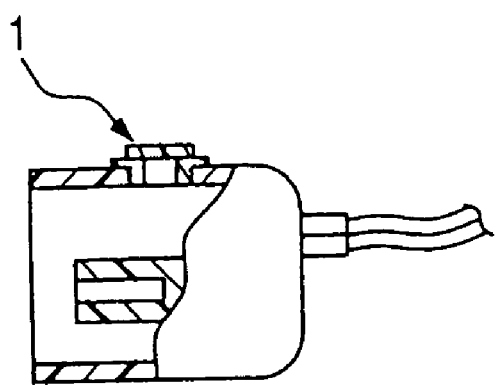
FIG. 9B is a sectional view taken on line B–B' in FIG. 9A.
Figure 10A:
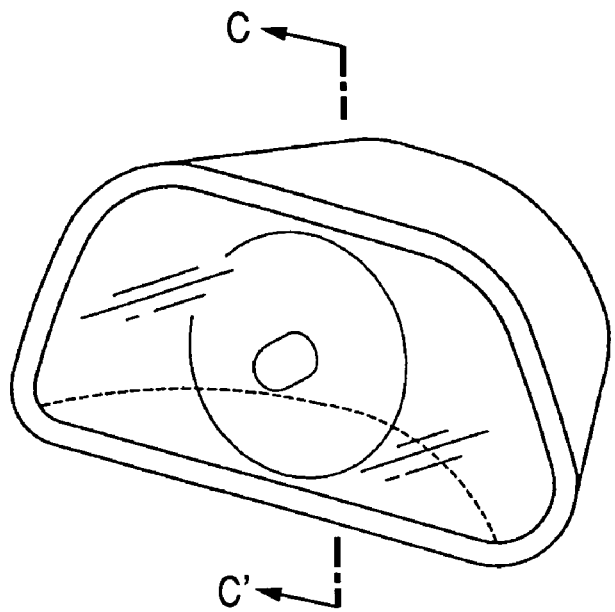
FIG. 10A is a perspective view of an automobile lamp to which a ventilation member according to the invention has been fixed.
Figure 10B:
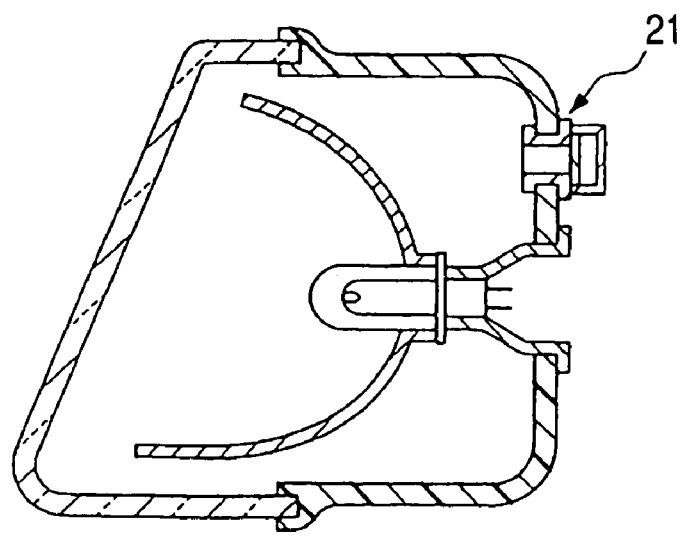
FIG. 10B is a sectional view taken on line C–C' in FIG. 10A.
Figure 11:
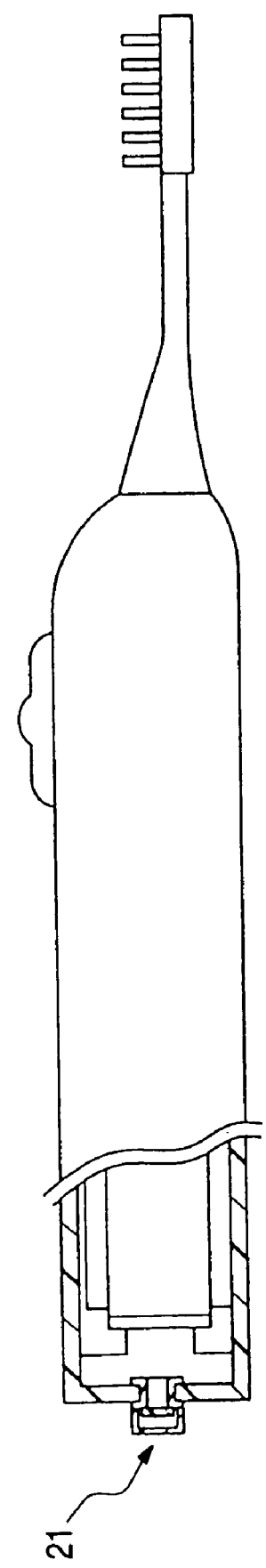
FIG. 11 is a partially sectional view of an electric toothbrush to which a ventilation member according to the invention has been fixed.
Figure 12A:
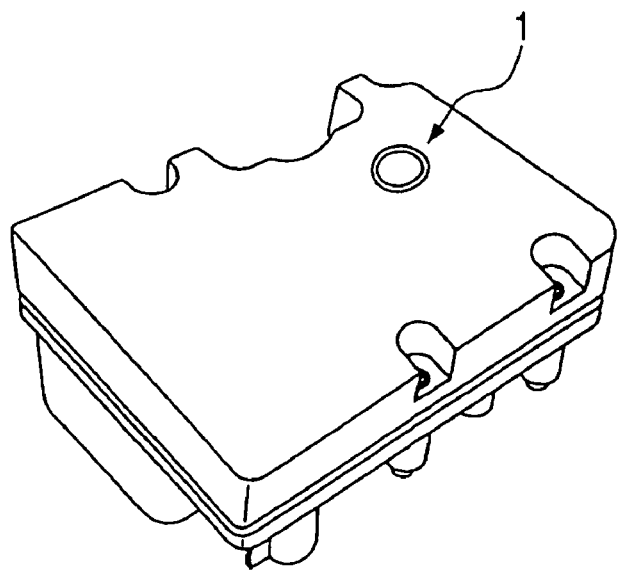
FIG. 12A is a perspective view of an ECU to which a ventilation member according to the invention has been fixed.
Figure 12B:
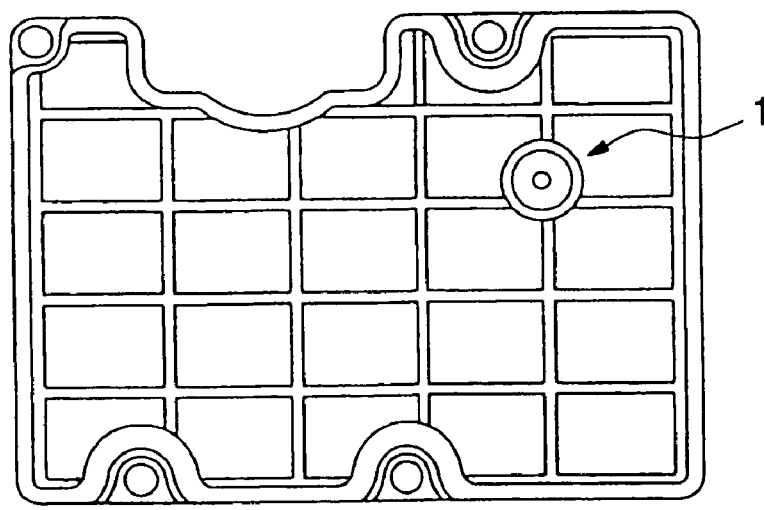
FIG. 12B is a back view of a top cover of an ECU cover.

Description will be made further in detail. As shown in FIGS. 8A to 8C, a tapered surface 7a getting higher in height in the direction of rotating the support 2 is formed in the inner surface of the housing 7, and the fitting grooves 7b for fitting the protrusion portions 2p thereto are formed ahead of the tapered surface 7a. After the protrusion portions 2p have climbed over the tapered surface 7a and fitted into the fitting grooves 7b, the support 2 cannot be detached from the housing 7 easily. Thus, the possibility that the ventilation member 21 is pulled out of the housing 7 is reduced.

Incidentally, although four protrusion portions 2p are formed in the embodiment shown in FIGS. 7A and 7B and FIGS. 8A to 8C, the invention is not limited thereto. It will go well if at least one protrusion portion 2p is formed. When a plurality of protrusion portions are formed circumferentially at an equal interval, the ventilation member 21 can be firmly fixed to the housing 7.

Next, FIGS. 9A, 9B, 10A, 10B, 11, 12A and 12B show examples of vented housings to which ventilation members according to the invention have been fixed respectively. The ventilation member 1 shown in FIG. 1 has been fixed to a connector shown in FIGS. 9A and 9B. The ventilation member 21 shown in FIGS. 7A and 7B has been fixed to an automobile lamp shown in FIGS. 10A and 10B. The ventilation member 21 shown in FIGS. 7A and 7B has been fixed to an electric toothbrush shown in FIG. 11. The ventilation member 1 shown in FIG. 1 has been fixed to an ECU shown in FIGS. 12A and 12B. However, housings to which ventilation members according to the invention are fixed are not limited to these housings. In addition, the number of ventilation members according to the invention to be fixed to a housing is not limited particularly. A plurality of ventilation members may be attached to different sides of a housing or one and the same side of a housing.

EXAMPLES

Although the invention will be described below in further detail by use of its examples, the invention is not limited to the following examples.

Example 1

As Example 1, the ventilation member 1 shown in FIGS. 4A and 4B was produced as follows.

First, the support 2 having a structure shown in FIGS. 4A and 4B was obtained by injection molding out of PBT (CG7640 made by Teijin Ltd., melting point 225° C.). The supporting portion 2a of the obtained support was 2.5 mm in thickness and 16 mm in outer diameter, the insertion portion 2b of the obtained support was 12 mm in outer diameter, and the through holes 3 provided in the insertion portion 2b were 8 mm in inner diameter.

Next, a PTFE porous material (Microtex NTF1131 made by Nitto Denko Corp., melting point 327° C.) 0.085 mm in thickness and 20 mm in outer diameter was prepared as the breathable film 4, and polyester-based nonwoven fabric (Axtar made by Toray Industries, Inc., melting point 230° C.) 0.2 mm in thickness was prepared as the reinforcement material 5. The breathable film 4 and the reinforcement material 5 were contact-bonded by heating deposition at a temperature of 260° C. and at a pressure of $5.0 \times 10^5$ Pa for 10 seconds. Thus, a laminate 6 was obtained.

Successively, the laminate 6 was punched out with an outer diameter of 10 mm. The reinforcement material 5 of the laminate 6 was brought into contact with the supporting portion 2a so as to cover the through holes 3 provided in the supporting portion 2a, and contact-bonded to the supporting portion 2a by heating deposition at a temperature of 260° C. and at a pressure of $5.0 \times 10^5$ Pa for 30 seconds. Next, the protective portion 2e was produced by injection molding out of PBT (CG7640 made by Teijin Ltd., melting point 225° C.). The protective portion 2e was 3.5 mm in thickness and 16 mm in outer diameter. Next, the protective portion 2e and the supporting portion 2a were fixedly attached to each other by heating deposition. Finally, an O-ring made of EPDM as the seal portion 2d was fitted onto the insertion portion 2b. Thus, the ventilation member 1 was obtained.

On the other hand, a housing 7 to which the ventilation member 1 was to be fixed was produced by injection molding out of PBT (CG7640 made by Teijin Ltd., melting point 225° C.). The outer wall of the obtained housing 7 was 2 mm in thickness, and the opening portion 8 was 12 mm in inner diameter. The ventilation member 1 was screwed to the housing 7 by hand. Thus, a vented housing was obtained.

Example 2

As Example 2, the ventilation member 1 shown in FIGS. 4A and 4B was produced as follows.

First, the support 2 having a structure shown in FIGS. 4A and 4B was obtained by injection molding out of PP (AW564 made by Sumitomo Chemical Co., Ltd., melting point 165° C.). The supporting portion 2a of the obtained support was 2.5 mm in thickness and 16 mm in outer diameter, the insertion portion 2b of the obtained support was 12 mm in outer diameter, and the through holes 3 provided in the insertion portion 2b were 8 mm in inner diameter.

Next, a PTFE porous material (Microtex NTF1026 made by Nitto Denko Corp., melting point 327° C.) 0.02 mm in thickness and 20 mm in outer diameter was prepared as the breathable film 4, and polyester-based nonwoven fabric (Axtar made by Toray Industries, Inc., melting point 230° C.) 0.2 mm in thickness was prepared as the reinforcement material 5. The breathable film 4 and the reinforcement material 5 were contact-bonded by heating deposition at a temperature of 260° C. and at a pressure of $5.0 \times 10^5$ Pa for 10 seconds. Thus, a laminate 6 was obtained.

Successively, the laminate 6 was punched out with an outer diameter of 10 mm. The reinforcement material 5 of the laminate 6 was brought into contact with the supporting portion 2a so as to cover the through holes 3 provided in the supporting portion 2a, and contact-bonded to the supporting portion 2a by heating deposition at a temperature of 260° C. and at a pressure of $5.0 \times 10^5$ Pa for 30 seconds. Next, the protective portion 2e was produced by injection molding out of PP (AW564 made by Sumitomo Chemical Co., Ltd., melting point 165° C.). The protective portion 2e was 3.5 mm in thickness and 16 mm in outer diameter. Next, the protective portion 2e and the supporting portion 2a were fixedly attached to each other by heating deposition. Finally, an O-ring made of NBR as the seal portion 2d was outer-fitted to the insertion portion 2b. Thus, the ventilation member 1 was obtained. The ventilation member 1 was screwed to the opening portion 8 of a housing 7 similar to that in Example 1 by hand. Thus, a vented housing was obtained.

Example 3

As Example 3, the ventilation member 21 shown in FIGS. 7A and 7B was produced as follows.

First, the support 2 having a structure shown in FIGS. 7A and 7B was obtained by injection molding out of PBT (CG7640 made by Teijin Ltd., melting point 225° C.). The supporting portion 2a of the obtained support was 2.5 mm in thickness, the insertion portion 2b of the obtained support was 9.8 mm in outer diameter, the portion where the protrusion portions 2p were formed was 11.4 mm in outer diameter, and the through holes 3 provided in the insertion portion 2b were 7 mm in inner diameter. The outer shape of the supporting portion 2a observed in the gas permeable direction was an orthohexagon, 8 mm each side.

Next, a PTFE porous material (Microtex NTF1131 made by Nitto Denko Corp., melting point 327° C.) 0.085 mm in thickness and 20 mm in outer diameter was prepared as the breathable film 4, and polyester-based nonwoven fabric (Axtar made by Toray Industries, Inc., melting point 230° C.) 0.2 mm in thickness was prepared as the reinforcement material 5. The breathable film 4 and the reinforcement material 5 were contact-bonded by heating deposition at a temperature of 260° C. and at a pressure of $5.0 \times 10^5$ Pa for 10 seconds. Thus, a laminate 6 was obtained.

Successively, the laminate 6 was punched out with an outer diameter of 8 mm. The reinforcement material 5 of the laminate 6 was brought into contact with the supporting portion 2a so as to cover the through holes 3 provided in the supporting portion 2a, and contact-bonded to the supporting portion 2a by heating deposition at a temperature of 260° C. and at a pressure of $5.0 \times 10^5$ Pa for 30 seconds. Next, the protective portion 2e was produced by injection molding out of PBT (CG7640 made by Teijin Ltd., melting point 225° C.). The protective portion 2e was 3.5 mm in thickness. In addition, the outer shape of the protective portion 2e observed in the gas permeable direction was an orthohexagon, 8 mm each side.

Next, the protective portion 2e and the supporting portion 2a were fixedly attached to each other by heating deposition. Finally, an O-ring made of EPDM as the seal portion 2d was inserted into the insertion portion 2b. Thus, the ventilation member 21 was obtained.

On the other hand, a housing to which the ventilation member 21 was to be fixed was produced by injection molding out of PBT (CG7640 made by Teijin Ltd., melting point 225° C.). The outer wall of the obtained housing was 2 mm in thickness, and the opening portion 8 was 12 mm in inner diameter in the portion where the guide grooves 8b were formed and 10 mm in inner diameter in the other portion. The ventilation member 21 was rotated to be inserted into the opening portion 8 of the housing 7. Thus, a vented housing was obtained.

Example 4

As Example 4, the ventilation member 21 shown in FIGS. 7A and 7B was produced as follows.

First, the support 2 having a structure shown in FIGS. 7A and 7B was obtained by injection molding out of PP (AW564 made by Sumitomo Chemical Co., Ltd., melting point 165° C.). The supporting portion 2a of the obtained support was 2.5 mm in thickness, the insertion portion 2b of the obtained support was 9.8 mm in outer diameter, the portion where the protrusion portions 2p were formed was 11.4 mm in outer diameter, and the through holes 3 provided in the insertion portion 2b were 7 mm in inner diameter. The outer shape of the supporting portion 2a observed in the gas permeable direction was an orthoquadrangle, 16 mm each side.

Next, a PTFE porous material (Microtex NTF1026 made by Nitto Denko Corp., melting point 327° C.) 0.02 mm in thickness and 20 mm in outer diameter was prepared as the breathable film 4, and polyester-based nonwoven fabric (Axtar made by Toray Industries, Inc., melting point 230° C.) 0.2 mm in thickness was prepared as the reinforcement material 5. The breathable film 4 and the reinforcement material 5 were contact-bonded by heating deposition at a temperature of 260° C. and at a pressure of $5.0 \times 10^5$ Pa for 10 seconds. Thus, a laminate 6 was obtained.

Successively, the laminate 6 was punched out with an outer diameter of 8 mm. The reinforcement material 5 of the laminate 6 was brought into contact with the supporting portion 2a so as to cover the through holes 3 provided in the supporting portion 2a, and contact-bonded to the supporting portion 2a by heating deposition at a temperature of 260° C. and at a pressure of $5.0 \times 10^5$ Pa for 30 seconds. Next, the protective portion 2e was produced by injection molding out of PP (AW564 made by Sumitomo Chemical Co., Ltd., melting point 165° C.). The protective portion 2e was 3.5 mm in thickness. In addition, the outer shape of the protective portion 2e observed in the gas permeable direction was an orthoquadrangle, 16 mm each side. Next, the protective portion 2e and the supporting portion 2a were fixedly attached to each other by heating deposition. Finally, an O-ring made of NBR as the seal portion 2d was outer-fitted to the insertion portion 2b. Thus, the ventilation member 21 was obtained. The ventilation member 21 was rotated to be inserted into the opening portion 8 of the housing 7 similar to that in Example 3. Thus, a vented housing was obtained.

Comparative Example 1

Figure 13A:
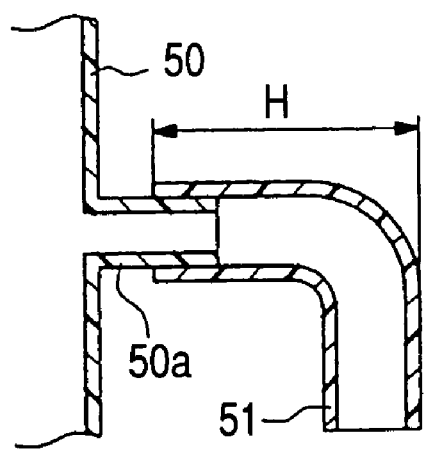
FIGS. 13A and 13B are sectional views for explaining an example of a related-art ventilation member.
Figure 13B:
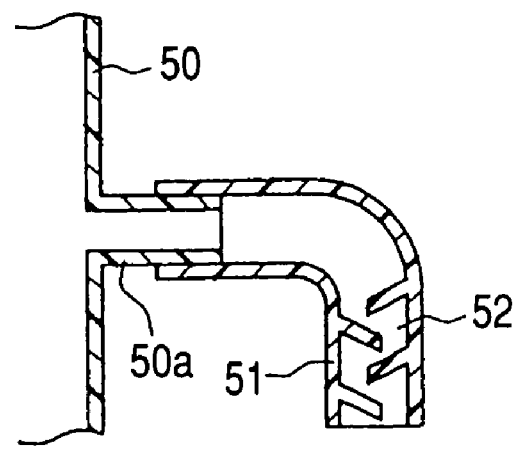

The ventilation member 51 shown in FIG. 13A was produced by molding and hot curing out of a material having styrene-butadiene rubber (Tufdene 1000 made by Asahi-Kasei Corp., bending modulus $4.0 \times 10^8$ N/m$^2$) as its chief component. The obtained ventilation member 51 was 7.5 mm in inner diameter, 11.5 mm in outer diameter, 2 mm in thickness, and 40 mm in height H.

On the other hand, the housing 50 shown in FIG. 13A was produced by injection molding as a housing to which the ventilation member 51 was to be fixed. The neck portion 50a was formed into a hollow columnar shape, whose outer diameter was larger by 20% than the inner diameter of the ventilation member 51. The ventilation member 51 was outer-fitted to the neck portion 50a for 8 mm. Thus, a vented housing was obtained.

Comparative Example 2

Figure 14A:
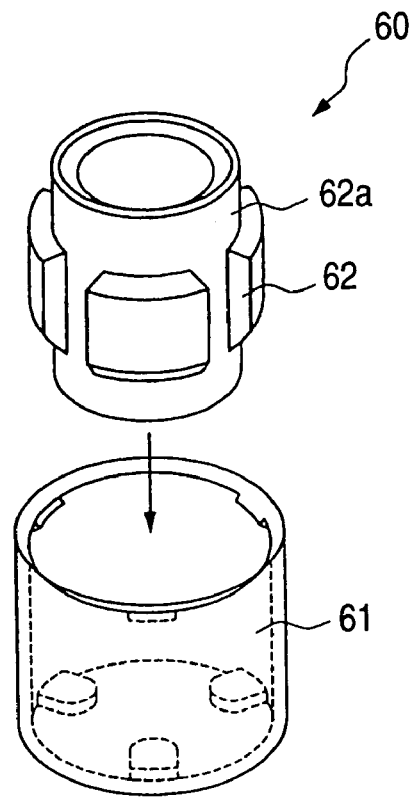
FIG. 14A is an exploded view for explaining another example of a related-art ventilation member.
Figure 14B:
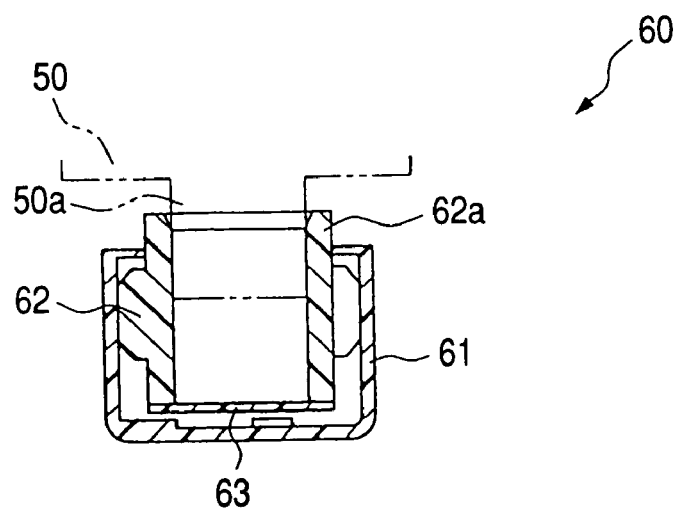
FIG. 14B is a sectional view of the ventilation member shown in FIG. 14A.
Figure 15:
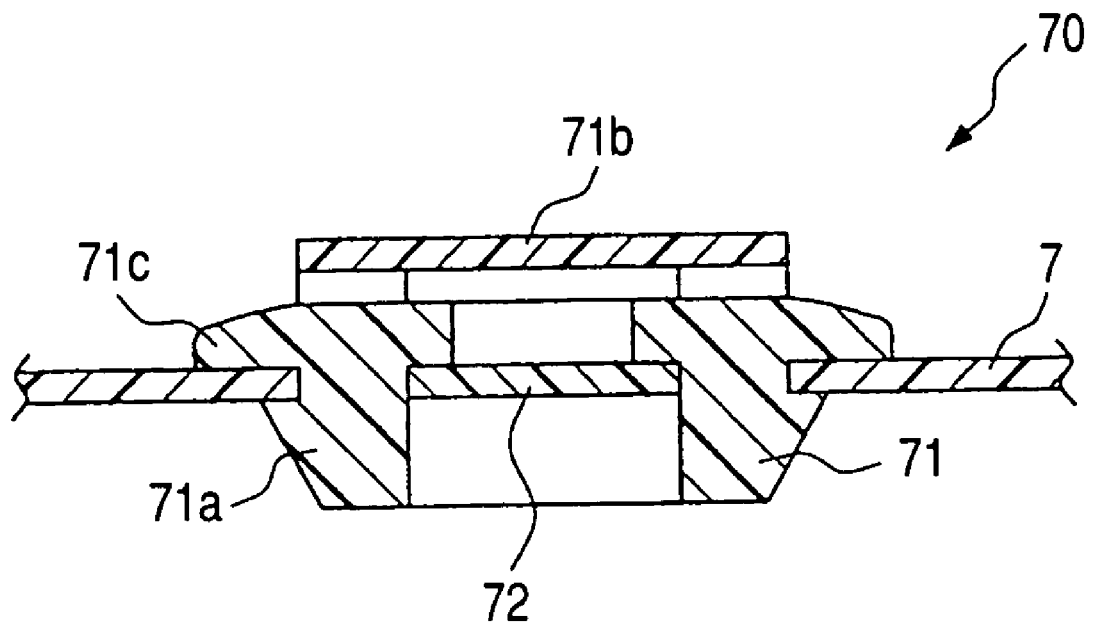
FIG. 15 is a sectional view for explaining another example of a related-art ventilation member.

The cover part 61 and the substantially cylindrical body 62 shown in FIGS. 14A and 14B were produced by injection molding out of PP (UBE Polypro J815HK made by Ube Industries, Ltd., bending modulus $1.47 \times 10^9$ N/m$^2$) and out of thermoplastic elastomer (Milastomer 6030 made by Mitsui Chemicals Inc., bending modulus $4.41 \times 10^8$ N/m$^2$), respectively. The obtained cover part 61 was 17.5 mm in outer diameter and 15.5 mm in inner diameter, and the obtained substantially cylindrical body 62 was 15.5 mm in maximum outer diameter and 7.5 mm in inner diameter in the top portion opening portion 62a.

In addition, a PTFE porous material (Microtex NTF1026 made by Nitto Denko Corp., 0.02 mm in thickness, 0.6 μmin average pore size, and 80% in porosity) was prepared as the ventilation filter 63. Next, the ventilation filter 63 was brought into contact with the bottom portion of the obtained substantially cylindrical body 62, and then pressed against the bottom portion of the obtained substantially cylindrical body 62 by heating deposition at a temperature of 150° C. and at a pressure of $10 \times 10^4$ Pa for 10 seconds. Then, the substantially cylindrical body 62 was fitted to the upper cover part 61. Thus, the ventilation member 60 was obtained.

On the other hand, the housing 50 shown in FIG. 14B was produced by injection molding as a housing to which the ventilation member 60 was to be fixed. The neck portion 50a was formed into a hollow columnar shape, whose outer diameter was larger by 20% than the inner diameter of the top portion opening portion 62a. The ventilation member 60 was outer-fitted to the neck portion 50a for 8 mm. Thus, a vented housing was obtained.

Pull-out force was measured in the following method upon the vented housings obtained thus. Table 1 shows the measurement results.

In the "pull-out test", each ventilation member was pulled under the condition of a rate of pulling of $8.33 \times 10^{-4}$ m/s in the direction to pull the ventilation member out of the housing. Then, the maximum value at that time was regarded as pull-out force. Incidentally, when the pull-out force was not smaller than 30 N, it was judged to be impossible to pull out.

TABLE 1

| Pull-Out Force (N) | |
| --- | --- |
| Example 1 | impossible to pull out |
| Example 2 | impossible to pull out |
| Example 3 | impossible to pull out |
| Example 4 | impossible to pull out |
| Comparative Example 1 | 7.5 |
| Comparative Example 2 | 19.0 |

As described above, according to the invention, a ventilation member in which the possibility that the ventilation member is pulled out of a housing has been reduced, and a vented housing using the ventilation member can be provided.

What is claimed is:

1. A ventilation member comprising:
    a breathable film transmitting gas passing through an opening portion of a housing in a state in which said breathable film is fixed to said opening portion; and
    a support including a supporting portion for supporting said breathable film and an insertion portion to be inserted into said opening portion of said housing;
    wherein a lock structure for locking said support in said housing by rotating said support around a central axis of said support is formed in said insertion portion; and
    wherein said breathable film is one of a fluororesin porous material and a polyolefin porous material and said breathable film has been subjected to a liquid-repellent treatment with a polymer having a perfluoro alkyl group.

2. A ventilation member according to claim 1, wherein said lock structure is of a spiral groove formed in an outer circumference of said insertion portion.

3. A ventilation member according to claim 1, wherein said lock structure is of at least one protrusion portion formed in an outer circumference of an insertion-start-side end portion of said insertion portion.

4. A ventilation member according to claim 1, wherein a through hole is formed in said support, and said breathable film is fixedly attached to said supporting portion so as to cover said through hole.

5. A ventilation member according to claim 1, wherein a plurality of through holes are formed in a surface of said support covered with said breathable film.

6. A ventilation member according to claim 1, wherein said support includes a seal portion on a surface of said supporting portion facing said housing.

7. A ventilation member according to claim 1, wherein said support includes a protective portion covering at least a part of said breathable film from above of said breathable film.

8. A ventilation member according to claim 1, wherein said support has an outer shape selected from a circular shape and a polygonal shape when said support is observed in a gas permeable direction.

9. A ventilation member according to claim 1, wherein said support has an engagement structure with which a tool can be engaged.

10. A ventilation member according to claim 9, wherein said engagement structure includes at least one kind selected from a convex portion and a concave portion.

11. A ventilation member according to claim 9, wherein said engagement structure is formed in at least one surface selected from a surface of said support which can be viewed when said support is observed in a gas permeable direction from outside of said housing, and an outer circumferential surface of said support.

12. A ventilation member according to claim 1, wherein a reinforcement material is laminated to said breathable film.

13. A vented housing comprising a ventilation member according to claim 1, which is fixed to said opening portion of said housing.

14. A ventilation member, comprising:

a breathable film transmitting gas passing through an opening portion of a housing in a state in which said breathable film is fixed to said opening portion; and a support including a supporting portion for supporting said breathable film, and an insertion portion to be inserted into said opening portion of said housing, and having a columnar shape whose diameter is substantially the same as that of said opening portion of said housing, and at least one protrusion portion formed in an outer circumference of an insertion-start-side end portion of said insertion portion, said at least one protrusion portion being formed in a shape corresponding to said opening portion of said housing;

wherein said support is locked in said housing by rotating said support around a central axis of said support.

* * * * *